United States Patent
More et al.

(10) Patent No.: US 12,021,142 B2
(45) Date of Patent: *Jun. 25, 2024

(54) METHOD OF FORMING SOURCE/DRAIN EPITAXIAL STACKS

(71) Applicant: Taiwan Semiconductor Manufacturing Co., Ltd., Hsinchu (TW)

(72) Inventors: Shahaji B. More, Hsinchu (TW); Huai-Tei Yang, Hsin-Chu (TW); Shih-Chieh Chang, Taipei (TW); Cheng-Han Lee, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/876,255

(22) Filed: Jul. 28, 2022

(65) Prior Publication Data

US 2022/0367715 A1 Nov. 17, 2022

Related U.S. Application Data

(60) Continuation of application No. 16/895,673, filed on Jun. 8, 2020, now Pat. No. 11,569,383, which is a
(Continued)

(51) Int. Cl.
 *H01L 29/78* (2006.01)
 *H01L 21/02* (2006.01)
(Continued)

(52) U.S. Cl.
 CPC .... *H01L 29/7848* (2013.01); *H01L 21/02532* (2013.01); *H01L 21/02579* (2013.01);
(Continued)

(58) Field of Classification Search
 CPC .......... H01L 29/7848; H01L 21/02532; H01L 21/02579; H01L 21/0262; H01L 21/02639;
(Continued)

(56) References Cited

U.S. PATENT DOCUMENTS

| 7,015,116 B1 | 3/2006 | Lo et al. |
| 8,796,666 B1 | 8/2014 | Huang et al. |

(Continued)

OTHER PUBLICATIONS

Tan, Philp Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Thanh T Nguyen
(74) *Attorney, Agent, or Firm* — Sterne, Kessler, Goldstein & Fox P.L.L.C.

(57) ABSTRACT

The present disclosure describes a method to form silicon germanium (SiGe) source/drain epitaxial stacks with a boron doping profile and a germanium concentration that can induce external stress to a fully strained SiGe channel. The method includes forming one or more gate structures over a fin, where the fin includes a fin height, a first sidewall, and a second sidewall opposite to the first sidewall. The method also includes forming a first spacer on the first sidewall of the fin and a second spacer on the second sidewall of the fin; etching the fin to reduce the fin height between the one or more gate structures; and etching the first spacer and the second spacer between the one or more gate structures so that the etched first spacer is shorter than the etched second spacer and the first and second etched spacers are shorter than the etched fin. The method further includes forming an epitaxial stack on the etched fin between the one or more gate structures.

20 Claims, 13 Drawing Sheets

Related U.S. Application Data division of application No. 15/997,130, filed on Jun. 4, 2018, now Pat. No. 10,680,106.

(60) Provisional application No. 62/586,485, filed on Nov. 15, 2017.

(51) Int. Cl.
| | |
|---|---|
| *H01L 21/8238* | (2006.01) |
| *H01L 27/092* | (2006.01) |
| *H01L 29/161* | (2006.01) |
| *H01L 29/165* | (2006.01) |
| *H01L 29/167* | (2006.01) |
| *H01L 29/66* | (2006.01) |

(52) U.S. Cl.
CPC .... *H01L 21/0262* (2013.01); *H01L 21/02639* (2013.01); *H01L 21/823807* (2013.01); *H01L 21/823821* (2013.01); *H01L 21/823864* (2013.01); *H01L 27/0924* (2013.01); *H01L 29/167* (2013.01); *H01L 29/66803* (2013.01); *H01L 29/161* (2013.01); *H01L 29/165* (2013.01)

(58) Field of Classification Search
CPC ..... H01L 21/823807; H01L 21/823821; H01L 21/823864; H01L 27/0924; H01L 29/167; H01L 29/66803; H01L 29/161; H01L 29/165; H01L 21/823431; H01L 27/0886
See application file for complete search history.

(56) References Cited

U.S. PATENT DOCUMENTS

| | | | |
|---|---|---|---|
| 8,815,712 B2 | 8/2014 | Wan et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 10,680,106 B2 | 6/2020 | More et al. | |
| 11,569,383 B2 * | 1/2023 | More | H01L 29/7848 |
| 2016/0211338 A1 | 7/2016 | Wang et al. | |
| 2017/0250281 A1 * | 8/2017 | Tsai | H01L 21/823431 |
| 2020/0303548 A1 | 6/2020 | More et al. | |

OTHER PUBLICATIONS

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

* cited by examiner

METHOD OF FORMING SOURCE/DRAIN EPITAXIAL STACKS

CROSS-REFERENCE TO RELATED APPLICATION

This application is a continuation of U.S. Non-Provisional patent application Ser. No. 16/895,673, filed on Jun. 8, 2020 and titled "Method of Forming Source/Drain Epitaxial Stacks," which is a divisional of U.S. Non-Provisional patent application Ser. No. 15/997,130 (now U.S. Pat. No. 10,680,106), filed on Jun. 4, 2018 and titled "Method of Forming Source/Drain Epitaxial Stacks," which claims the benefit of U.S. Provisional Patent Application No. 62/586,485, filed on Nov. 15, 2017 and titled "Method of Forming Source/Drain Epitaxial Stacks," all of which are incorporated by reference herein in their entireties.

BACKGROUND

A fully strained channel can improve carrier mobility and reduce channel resistance in semiconductor devices, such as complementary metal oxide semiconductor (CMOS) devices. Additionally, a strain-induced drive current enhancement (e.g., due to carrier mobility improvements) can be used for CMOS devices with scaled channel lengths.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
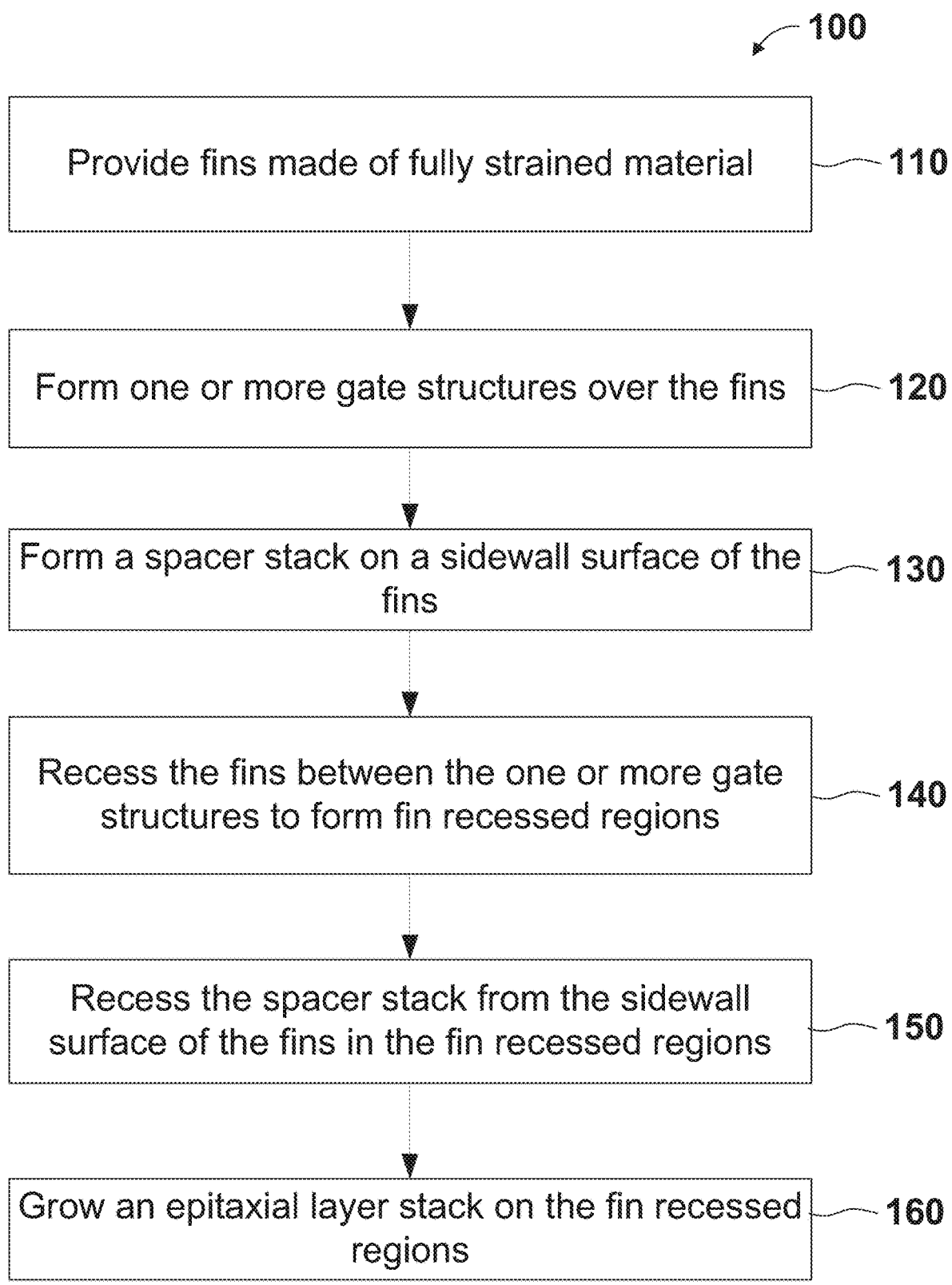
FIG. 1 is a flow chart of an exemplary fabrication method for forming a SiGe source/drain epitaxial stack with one or more epitaxial layers, according to some embodiments

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A type of FET is referred to as a metal oxide semiconductor field effect transistor (MOSFET). MOSFETs can be planar structures built in and on the planar surface of a substrate such as a semiconductor wafer. MOSFETs can also be three-dimensional, vertically-oriented structures with a semiconductor material called fins. The term "fin-FET" refers to a FET that is formed over a semiconductor (e.g., silicon) fin that is vertically oriented with respect to the planar surface of a wafer.

The expression "epitaxial layer" herein can refer to a layer or structure of crystalline material. Likewise, the expression "epitaxially grown" herein can refer to the process of growing a layer, or structure, of crystalline material. Epitaxially grown material may be doped or undoped.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of the value.

The term "about", as used herein indicates the value of a given quantity that can vary based on a particular technology node associated with the subject semiconductor device. Based on the particular technology node, the term "about"

can indicate a value of a given quantity that varies within, for example, 5-30% of the value (e.g., ±5%, ±10%, ±20%, or ±30% of the value).

The term "vertical," as used herein, means nominally perpendicular to the surface of a substrate.

A fully strained channel can improve a transistor's carrier mobility and reduce its channel resistance. Additionally, a strain-induced drive current enhancement (e.g., due to carrier mobility improvements) can be achieved for transistors with scaled channel lengths. The materials used in strained channels can be different for p-type field effect transistors (PFETs) and n-type field effect transistors (NFETs). By way of example and not limitation, electron mobility in an NFET can be enhanced with the use of fully strained carbon-doped silicon (Si:C) channels, while hole mobility in PFETs can be enhanced with fully strained silicon germanium (SiGe) channels. Fully strained epitaxial channels can be derived from epitaxial layers formed on a top portion of a fin. The formation process of a fully strained channel can be challenging and may require numerous fabrication steps—such as patterning, pre-cleans, anneals, epitaxial growth processes, etc.

An intrinsic stress of a fully strained channel may not be immune to relaxation. For example, a fully strained epitaxial channel may relax during fabrication steps in a middle of the line (MOL) or a back end of the line (BEOL). Further, stress relaxation can occur in transistors (e.g., FETs) at the end of a long row of transistors due to the absence of neighboring transistors. If the stress in the fully strained epitaxial channel is relaxed, the carrier mobility will likely decrease.

The embodiments described herein are directed to an exemplary fabrication method of forming a SiGe source/drain epitaxial stack that can induce external stress to respective SiGe fully strained channels on desired devices. The SiGe source/drain epitaxial stack may include three or more sub-layers with different boron dopant and germanium concentrations. The SiGe source/drain epitaxial layer, based on their boron dopant profile and germanium concentration, can induce external stress to a fully strained SiGe channel. According to some embodiments, the external stress can offset a possible stress loss in a fully strained SiGe channel. A SiGe source drain/epitaxial layer, as described in the embodiments herein, may exhibit a stress gradient. For example, the stress induced to the fully strained SiGe channel region can be higher at an upper portion of the channel as compared to a lower portion of the channel.

FIG. 1 is a flow chart of an exemplary fabrication method 100. Fabrication method 100 describes the formation of a SiGe source/drain epitaxial stack with one or more epitaxial layers that can induce a stress gradient to a fully strained channel region along its height. In some embodiments, exemplary fabrication method 100 can provide a SiGe source/drain epitaxial stack of one or more epitaxial layers with different boron dopant profiles, germanium concentration, and shape. Other operations may be performed between one or more of the operations of exemplary fabrication method 100 and are omitted for clarity. Exemplary fabrication method 100 may not be limited to the operations described below and may include additional operations. The figures provided to describe exemplary fabrication method 100 are for illustrative purposes only and are not to scale. In addition, the figures may not reflect the actual geometry of structures, features, or films. Some structures, films, or geometries may have been deliberately augmented for illustrative purposes.

Exemplary fabrication method 100 begins with operation 110, where fins made of a fully strained material are provided over a substrate. For example, referring to FIG. 2, fins 200 can be made of a SiGe strained material 210. Fins 200 can also include a middle section made of an epitaxially grown silicon layer 220 over an n-type silicon region 230. In some embodiments, a dielectric layer 240 is formed between fins 200 so that SiGe strained material 210 is protruding above dielectric layer 240. According to some embodiments, a liner 250 covers the bottom portion of fins 200. Liner 250 can provide structural support to fins 200, according to some embodiments. By way of example and not limitation, liner 250 can be made of silicon nitride, silicon, or another suitable material. In some embodiments, a height H of each of the fins 200, measured from the top of silicon layer 220 to the tip of SiGe strained material 210, can range from about 30 nm to about 90 nm (e.g., 60 nm). In other words, the height of SiGe strained material 210 is the height H of fins 200. In some embodiments, the germanium (Ge) concentration in atomic percentage (at. %) can be constant throughout the height of SiGe strained material 210 (e.g., along the z-direction) and may range from about 20 at. % to about 40 at. %. In some embodiments, strained material 210 may include a first top sub-layer with a germanium concentration gradient that ranges from 0 to about 5 at. %, and a second bottom sub-layer with a constant germanium concentration that ranges from about 20 at. % to about 40 at. %. The thickness of the top sub-layer can be about 25 nm and the thickness of the bottom sub-layer can range from about 5 nm to about 65 nm. The aforementioned germanium concentrations are exemplary and not limiting. Therefore, different germanium concentrations are possible.

Figure 2:
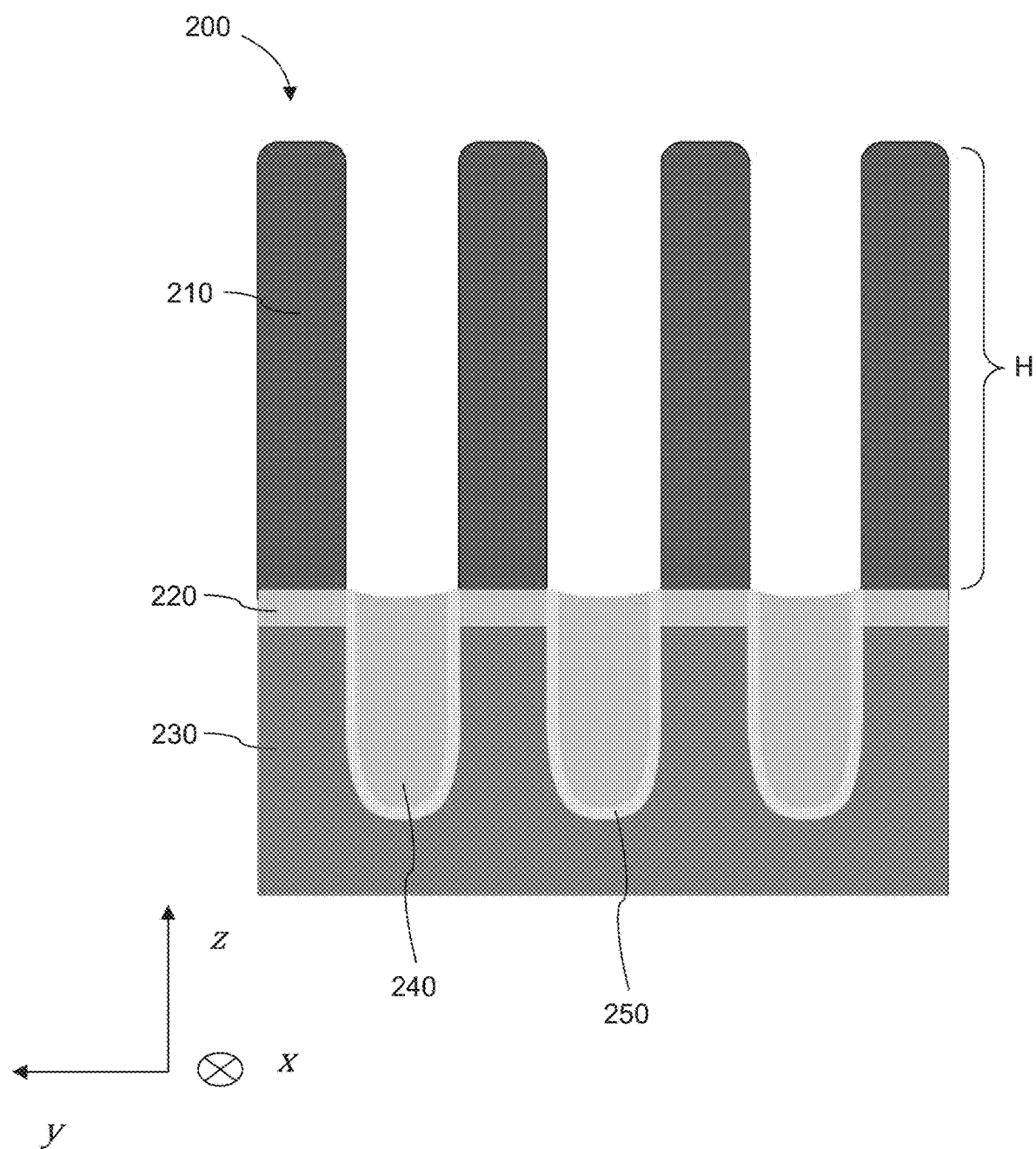
FIG. 2 is a cross-sectional view of example fully strained fins over a substrate, according to some embodiments.

In FIG. 2, fins 200 are shown in the y-direction—e.g., along their width. The length of fins 200 in FIG. 2 is in the x-direction, which points into the page. According to some embodiments, n-type region 230 can be formed in a top portion of a substrate which is not shown in FIG. 2. According to some embodiments, the substrate can be made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

For example purposes, n-type region 230 will be described in the context of an n-type doped silicon region. According to some embodiments, the n-type dopant for n-type region 230 may include (As), antimony (Sb), or phosphorous (P). According to some embodiments, the n-type dopant concentration in n-type region 230 can range from about $5 \times 10^{16}$ atoms/cm$^3$ to about $1 \times 10^{19}$ atoms/cm$^3$. Based on the disclosure herein, other materials (as discussed above) can be used and are within the spirit and scope of this disclosure.

According to some embodiments, dielectric layer 240 can be, for example, a shallow trench isolation (STI) made of silicon oxide, silicon nitride, silicon oxynitride, fluorine-doped silicate glass (FSG), a low-k dielectric material (e.g., with a k value lower than 3.9), and/or other suitable insulating material with appropriate fill properties. Additionally, dielectric layer 240 may include a multi-layer structure, for example, having one or more of the aforementioned dielectric layers. In some embodiments, dielectric layer 240 may be deposited with a chemical vapor deposition (CVD) process, a plasma enhanced CVD (PECVD) process, or a flowable CVD (FCVD) process.

According to some embodiments, additional or fewer fins 200 are possible. Therefore, the number of fins 200 shown in FIG. 2 is not limiting. In addition, fins 200 can be arranged with a different spacing between them—e.g., fins 200 can have different fin-pitch. According to some embodiments, the fin-pitch may be different for an area of a chip with a first type of devices (e.g., logic devices) than an area of the chip with a second type of devices (e.g., memory cells, such as static random access memory cells).

Figure 3:
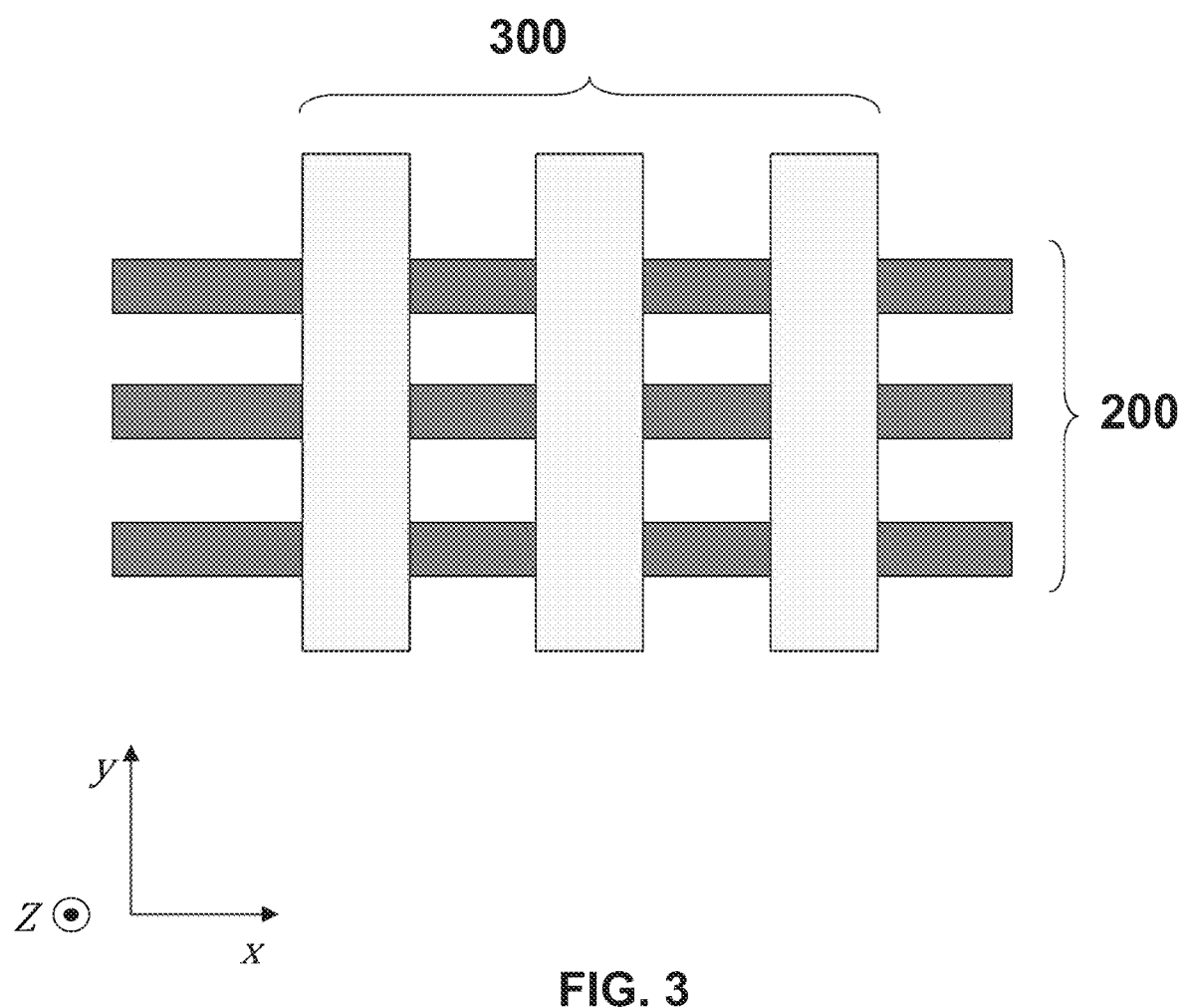
FIG. 3 is a top-view of example multiple gate structures over multiple fins, according to some embodiments.

Exemplary fabrication method 100 continues with operation 120 and the formation of one or more gate structures over fins 200. According to FIG. 3, gate structures 300 can be formed with their longest dimension along the y-direction—e.g., perpendicular to the length of fins 200, which can be along the x-direction. In some embodiments, gate structures 300 can be made of polycrystalline silicon (also referred to herein as "polysilicon").

Figure 4:
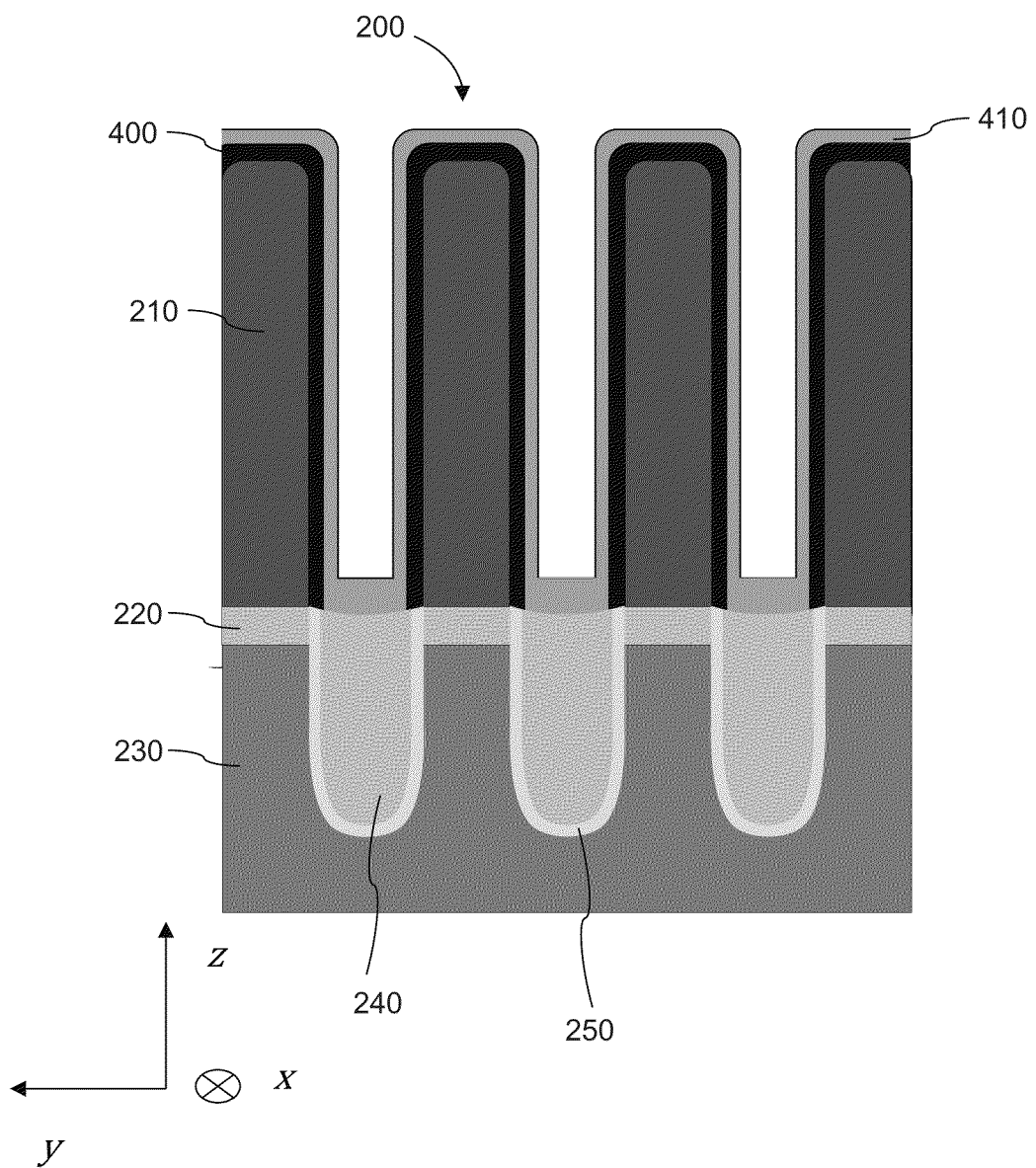
FIG. 4 is a cross-sectional view of example fully strained fins over a substrate after the formation of a silicon cap layer and a gate oxide thereon, according to some embodiments

By way of example and not limitation, the formation of gate structures 300 is described with respect to FIG. 4. A silicon cap layer 400 can be grown over SiGe strained material 210. In some embodiments, silicon cap layer 400 can be an epitaxial layer that does not grow on dielectric layer 240. Additionally, the thickness of silicon cap layer 400 can range from about 10 Å to about 100 Å (e.g., 30 Å). By way of example and not limitation, silicon cap layer 400 can be deposited with a CVD process. Possible silicon precursor gases for the cap layer formation may include silane ($SiH_4$), silicon tetrachloride ($SiCl_4$), trichlorosilane (TCS), or dichlorosilane ($SiH_2Cl_2$ or DSC). Hydrogen ($H_2$) can be used as a reactant gas to reduce the aforementioned silicon precursor gases.

Figure 5:
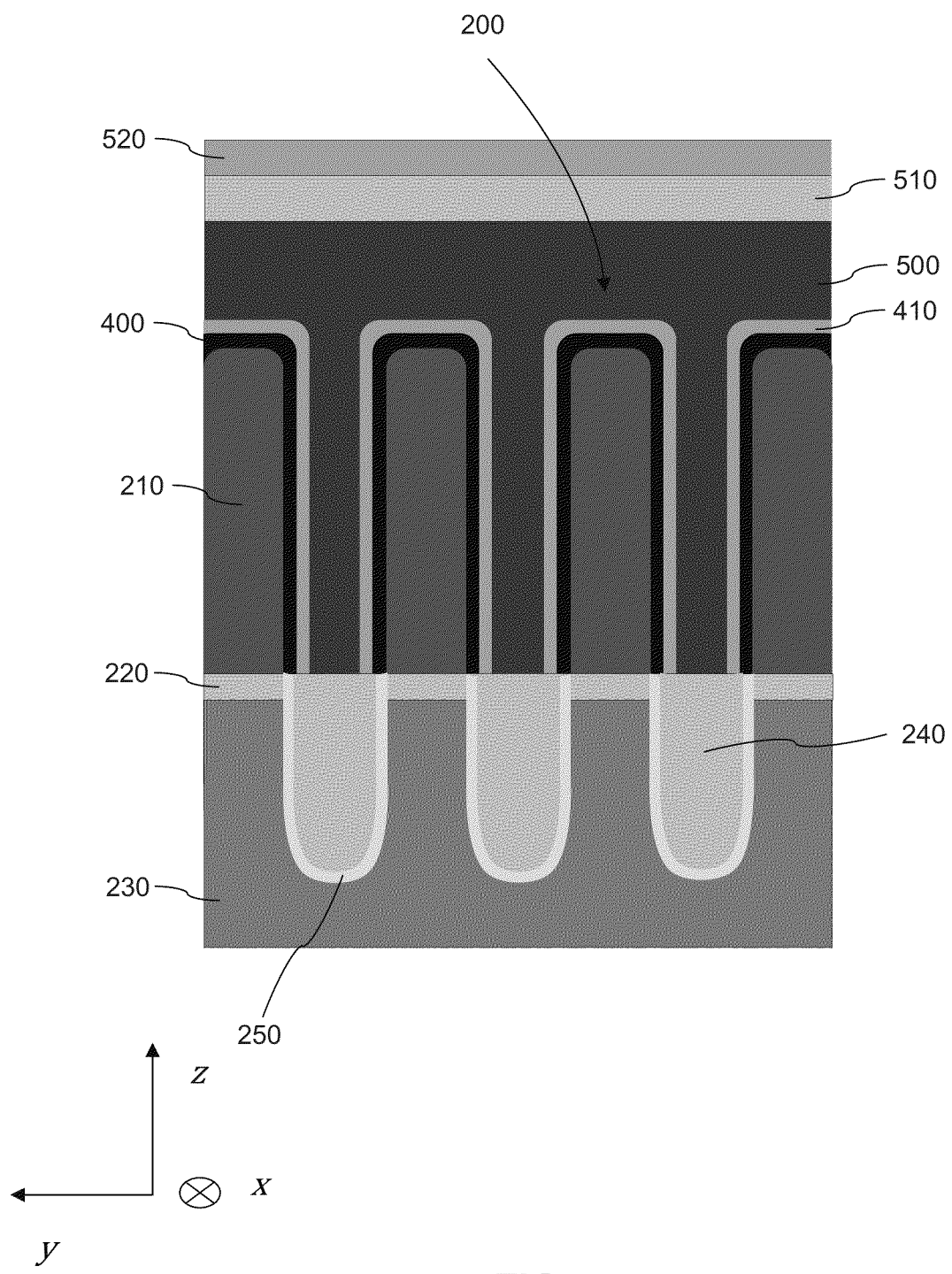
FIG. 5 is a cross-sectional view of example fully strained fins over a substrate after the formation of a polycrystalline silicon layer, according to some embodiments.
Figure 6:
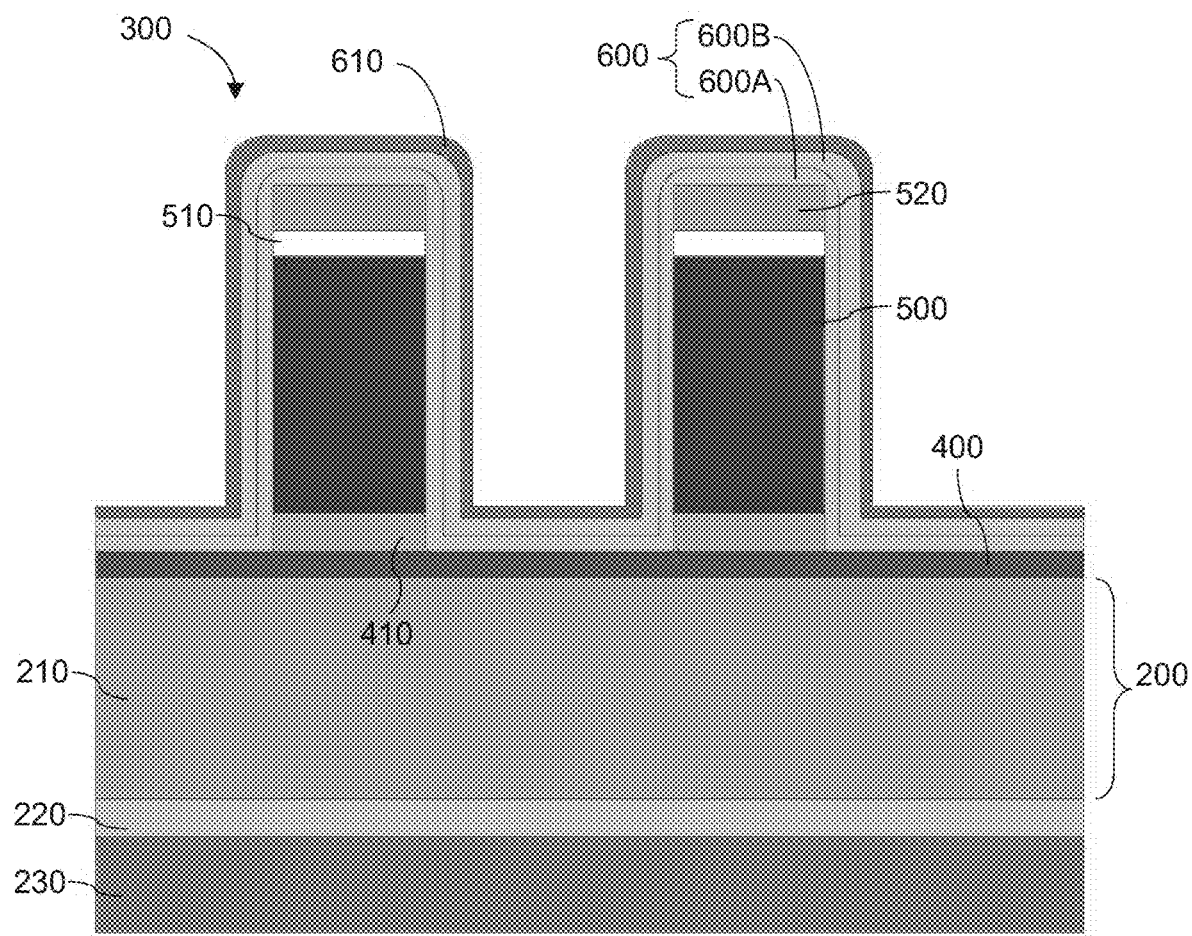
FIG. 6 is a cross-sectional view of example patterned gate structures on a fin after the deposition of a spacer stack, according to some embodiments.

Silicon cap layer 400 can be formed over SiGe strained material 210 so that an oxide layer can be grown thereon. For example, a gate oxide 410 can be thermally grown over silicon cap layer 400 and over dielectric layer 240. In some embodiments, gate oxide 410 can be a silicon oxide ($SiO_2$) layer. Referring to FIG. 5, and after the formation of gate oxide 410, a polysilicon layer 500 can be deposited over gate oxide 410, according to some embodiments. Polysilicon layer 500 can be a "blanket" layer over gate oxide 410 that covers fins 200. In some embodiments, polysilicon layer 500 can be subsequently patterned to form gate structures over fins 200. FIG. 6 is a cross-sectional view of exemplary patterned polysilicon gate structures 300 along the x-direction, according to some embodiments. In the view of FIG. 6, fin 200 is shown along its long axis (length in x-direction). Patterning of polysilicon layer 500 can be accomplished with photolithography and etch operations. Prior to patterning, a silicon nitride layer 510 and an oxide layer 520 can be deposited on polysilicon layer 500. Nitride layer 510 and oxide layer 520 can serve as hard mask layers in a subsequent polysilicon etch process during patterning.

By way of example, FIG. 6 shows two gate structures 300 over one of the fins 200. However, additional gate structures 300 can be formed alongside gate structures 300 and over one or more fins 200 (e.g., similar to FIG. 3). Gate structures 300 can be, for example, sacrificial gate structures that can be replaced with respective metal gate structures in a replacement metal gate process. According to some embodiments, the metal gate structures can include a metal gate electrode stack and a high-k gate dielectric with k-value greater than 3.9.

Exemplary fabrication method 100 continues with operation 130 and the formation of a spacer stack on a sidewall surface of the fins. In some embodiments, operation 130 can be a multi-step process. For example, and referring to FIG. 6, first spacer 600A is conformally deposited over gate structures 300 and fins 200. Consequently, first spacer 600A can cover gate structures 300 and fins 200, including their respective top and sidewall surfaces. In some embodiments, first spacer 600A can be a silicon oxy-carbon nitride (SiOCN) layer with a thickness between about 1 nm and about 10 nm (e.g., about 3 nm). According to some embodiments, first spacer 600A can be used as an implant mask, for example, during the formation of a lightly doped area in a source/drain region via an ion implantation process. The lightly doped area of the source/drain region (not shown in FIG. 6) is referred to as a "source/drain extension" or "lightly doped drain (LDD)." However, the term LDD is merely a naming convention and is not limited to the drain region; for example, LDD region can also include the lightly doped areas of the source region. The LDD regions are placed at a close proximity to the edges of the fully strained channel region as defined by the thickness of first spacer 600A, to provide a gradual dopant concentration to the source/drain regions. The LDD creates lateral and vertical doping profiles in the interface region of the fully strained channel edge. If an LDD is not formed, then high electric fields can be present between the source/drain regions and the fully strained channel region during transistor operation.

In some embodiments, after the LDD region formation, a second spacer 600B can be deposited over first spacer 600A. By way of example and not limitation, second spacer 600B can be a SiOCN layer with a thickness between about 1 nm and about 10 nm (e.g., about 3 nm). Similar to first spacer 600A, second spacer 600B can also extend over gate structures 300 and fins 200, including their respective top and sidewall surfaces. Since first and second spacers 600A and 600B can be similar in terms of material and thickness, they can be collectively referred to as spacer 600. In some embodiments, a third spacer 610 is deposited over spacer 600. Due to the cross-sectional view of FIG. 6, spacers 600 and 610 on the sidewalls of fin 200 are not shown. By way of example and not limitation, third spacer 610 can be silicon nitride ($SiN_x$) with a thickness between about 1 nm and 10 nm (e.g., about 4 nm). Similar to spacer 600, third spacer 610 also extends over gate structures 300 and fins 200, including their respective top and sidewall surfaces. In some embodiments, spacers 600 and 610 form a spacer stack.

Figure 7:
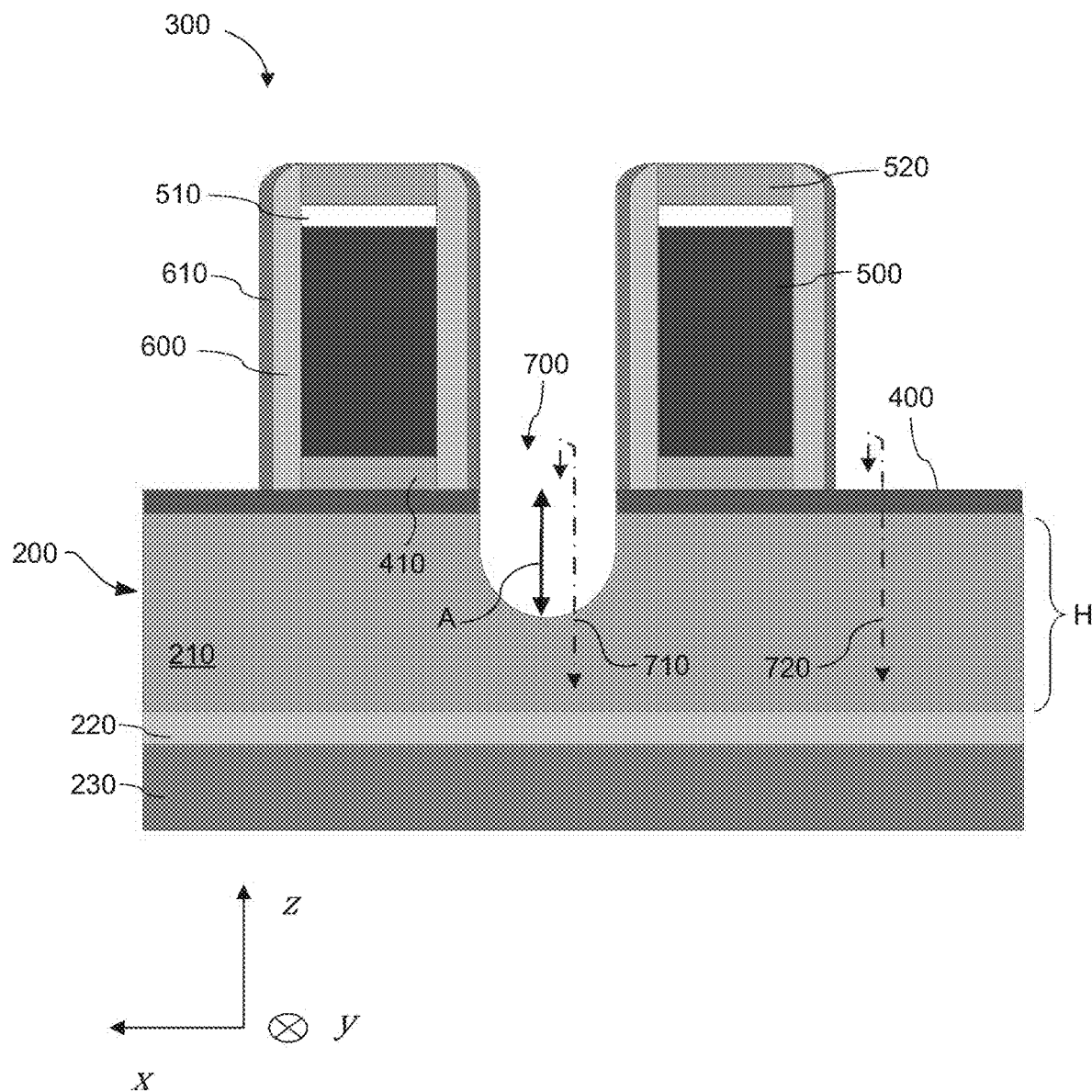
FIG. 7 is a cross-sectional view of example patterned gate structures on a fin after the formation of a fin recessed region between the patterned gate structures, according to some embodiments.

In some embodiments, spacers 600 and 610 can be etched with an anisotropic etching process so that spacers 600 and 610 are removed from the horizontal surfaces of gate structures 300 and fins 200. For example, spacers 600 and 610 can be removed from the top surfaces of gate structures 300 and fins 200, as shown in FIG. 7. However, spacers 600 and 610 are not removed from the sidewalls of gate structures 300 and fins 200.

Referring to FIG. 1 of fabrication method 100 and operation 140, fin 200 is selectively etched between gate structures 300 to reduce the fin's original height H and form a fin recess region 700 with height A, as shown in FIG. 7. Further, additional fin recessed regions, like fin recess region 700, can be formed in other locations of fin 200, between respective gate structures 300. In some embodiments, additional fins can feature recessed regions formed between their gate structures. In some embodiments, a SiGe source/drain epitaxial layer can be grown in the fin recessed regions, like fin recessed region 700. By way of example and not limitation, fin recessed region 700 in FIG. 7 can be formed with a dry etching process. In some embodiments, fin recessed region 700 is self-aligned to the space between the two neighboring gate structures 300. According to some embodiments, the dry etch process can be an anisotropic etch. In other words, the etch process may remove SiGe strained material 210 faster on the vertical z-direction and slower on the horizontal x-direction. As a result, fin recessed region 700 can have a height A that is greater than its width (in the x-direction). In this disclosure, height A of fin recessed region 700 can also be referred to as "recess amount A". In some embodiments, areas of fins 200 that are not intended to be recessed can be protected from the dry etch process with a patterned photoresist layer or a hard mask.

Figure 8:
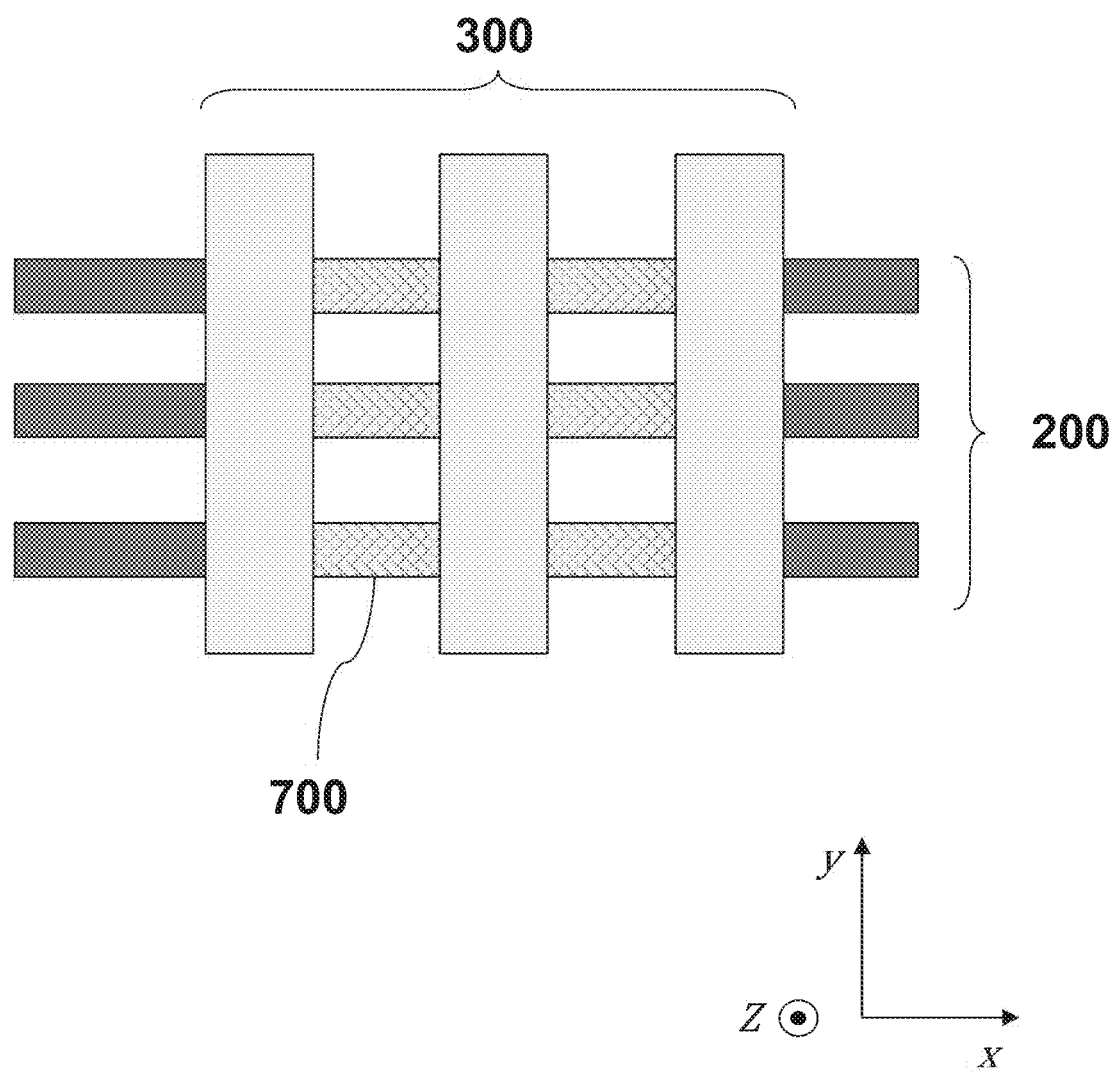
FIG. 8 is a top-view of example gate structures and fins after the formation of multiple fin recessed regions between neighboring gate structures, according to some embodiments.

As discussed above, multiple fin recessed regions 700 are possible. According to some embodiments, FIG. 8 is a top-view of gate structures 300 and fins 200 after the formation of multiple fin recessed regions 700 between neighboring gate structures 300. According to some embodiments, a fin can have multiple recessed regions 700 (or multiple recessed locations), as shown in FIG. 8.

Figure 9:
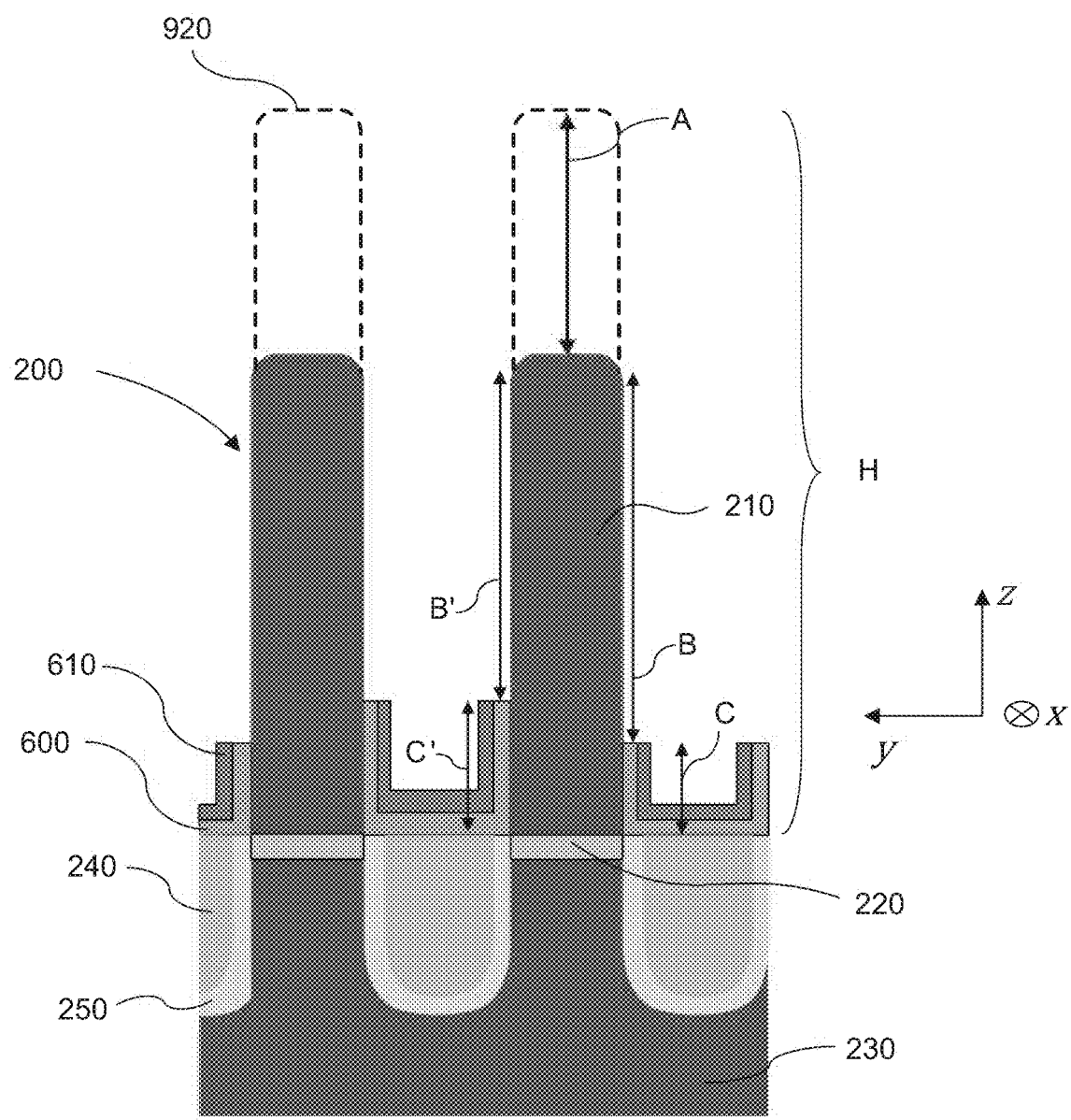
FIG. 9 is a cross-sectional view of exemplary fin recessed regions in an area of a chip with a first type of devices, according to some embodiments.

In operation 150 of fabrication method 100, the spacer stack (e.g., spacer 600 and spacer 610) can be partially recessed or "trimmed" (e.g., etched) from the sidewalls of fins 200. In some embodiments, operation 150 can be performed concurrently with operation 140 of fabrication method 100. For example, during the formation of recess regions 700, spacers 600 and 610 can be partially recessed so that a portion of the fin's sidewalls can be exposed; for example, as shown in FIG. 9, which is a cross-section along dotted line 710 in the y-direction of FIG. 7. Dashed lines 920 correspond to non-recessed regions of fins 200, for example, along line 720 of FIG. 7. Consequently, recess height A is the height difference between recessed and non-recessed regions of fins 200. Additionally, recess height A can be equal to the recess amount of the fin, between gate structures 300 as a result of operation 140 of fabrication method 100.

In some embodiments, spacers 600 and 610 are recessed to expose a portion B and B' of fins 200 in fin recessed region 700, as shown in FIG. 9. By way of example and not limitation, photolithography and etch operations can control the recess amount for spacers 600 and 610 on each sidewall surface of fins 200 in fin recessed region 700 during operation 150. Further, as shown in FIG. 9, the spacer stack can be etched so that its "inner" sidewall height C' is greater than its "outer" sidewall height C (e.g., C'>C), and the exposed "inner" portion B' of fin 200 in fin recessed region 700 is shorter than the exposed "outer" portion B of fin 200 (e.g., B'<B). According to some embodiments, recessed amount A of fin 200 in fin recessed region 700 is less than the fin's height at that location (e.g., A<[(B+C)=(B'+C')]). Consequently, fins 200 cannot be recessed more than 50% of their original height H—for example, [A/H]≤0.5. By way of example and not limitation, FIG. 9 may represent a fin recessed region 700 of fins 200 in an area of a chip with a first type of devices (e.g., logic devices).

According to some embodiments, in some areas of a chip, the "inner" sidewall height C' of the spacer stack can be equal to the "outer" sidewall height C (e.g., C'=C). Such areas of a chip are, for example, areas with a second type of devices (e.g., memory cells, such as static random access memory cells).

According to some embodiments, the sidewall heights C and C' of the spacer stack on the sidewall surface of fin recessed region 700 of fin 200 modulate the final size/volume of a SiGe source/drain epitaxial stack that can be formed in a subsequent operation in fin recessed region 700 of fin 200. For example, the size of the SiGe source/drain epitaxial layer can increase when the pair of C and C' are shorter than the fin height in fin recessed region 700. On the other hand, the size of the SiGe source/drain epitaxial layer can decrease when the pair of C and C are taller than the fin height in fin recessed region 700. As discussed above, the sidewall heights C and C' of the spacer stack can be controlled independently with photolithography operations. Therefore, different sidewall heights C and C' of spacers 600 and 610 can be obtained for the first and second type of devices.

In some embodiments, in fin recessed regions 700 of selective areas, fins 200 can be recessed by an additional amount to further reduce the fin height. Such areas can be, for example, the type 2 areas of the chip. By way of example and not limitation, additional fin recess in the type 2 areas can be accomplished by covering the type 1 areas of the chip with a photoresist mask or a hard mask to prevent further fin recess in the type 1 areas.

Figure 10:
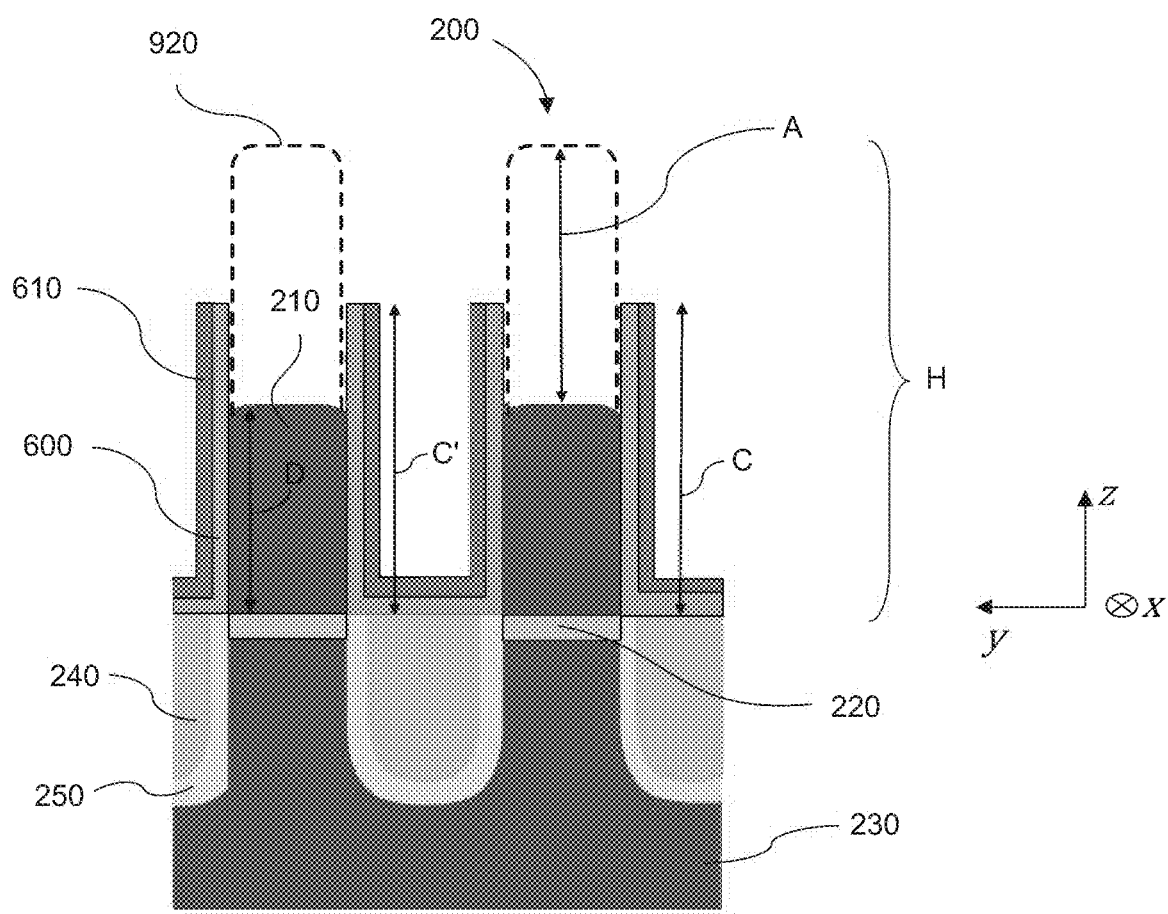
FIG. 10 is a cross-sectional view of exemplary fin recessed regions in an area of a chip with a second type of devices, according to some embodiments.

By way of example and not limitation, FIG. 10 can be an area of a chip with a second type of devices (e.g., memory cells, such as static random access memory cells) after an additional fin etching operation on fins 200 in fin recessed regions 700. As discussed above, in the area with the second type of devices, the sidewall height of the spacer stack (spacers 600 and 610) can be substantially equal between the "inner" and "outer" sidewall surfaces of fins 200 in fin recessed region 700. Further, fins 200 in fin recessed region 700 of the second type of devices, as shown in FIG. 10, have a height D that is shorter than the sidewall height C and C' of spacer 600 and spacer 610 (e.g., D<[C=C']). Further, in fin recessed region 700 of FIG. 10, the recessed amount A of fins 200 can be greater than the recessed fin height D. In some embodiments, fins 200 can be recessed more than 50% from their original height H—for example, [A/H]>0.5 in areas of the chip with the second type of devices. According to some embodiments, fins 200 cannot be recessed below the top surface of dielectric layer 240. Therefore, in some embodiments, the ratio of fin recess A to original fin height H is greater than 0.5 and less than 1 (e.g., 0.5<[A/(H)]<1).

Exemplary fabrication method 100 continues with operation 160, where a SiGe source/drain epitaxial stack can be grown on the recessed regions of fins 200 (e.g., on fin recessed region 700 of FIG. 7), according to some embodiments. It is noted that SiGe epitaxial layers cannot grow on the surfaces of fins 200 in fin recessed region 700 that are covered with the spacer layer stack of spacer 600 and spacer 610.

Figure 11:
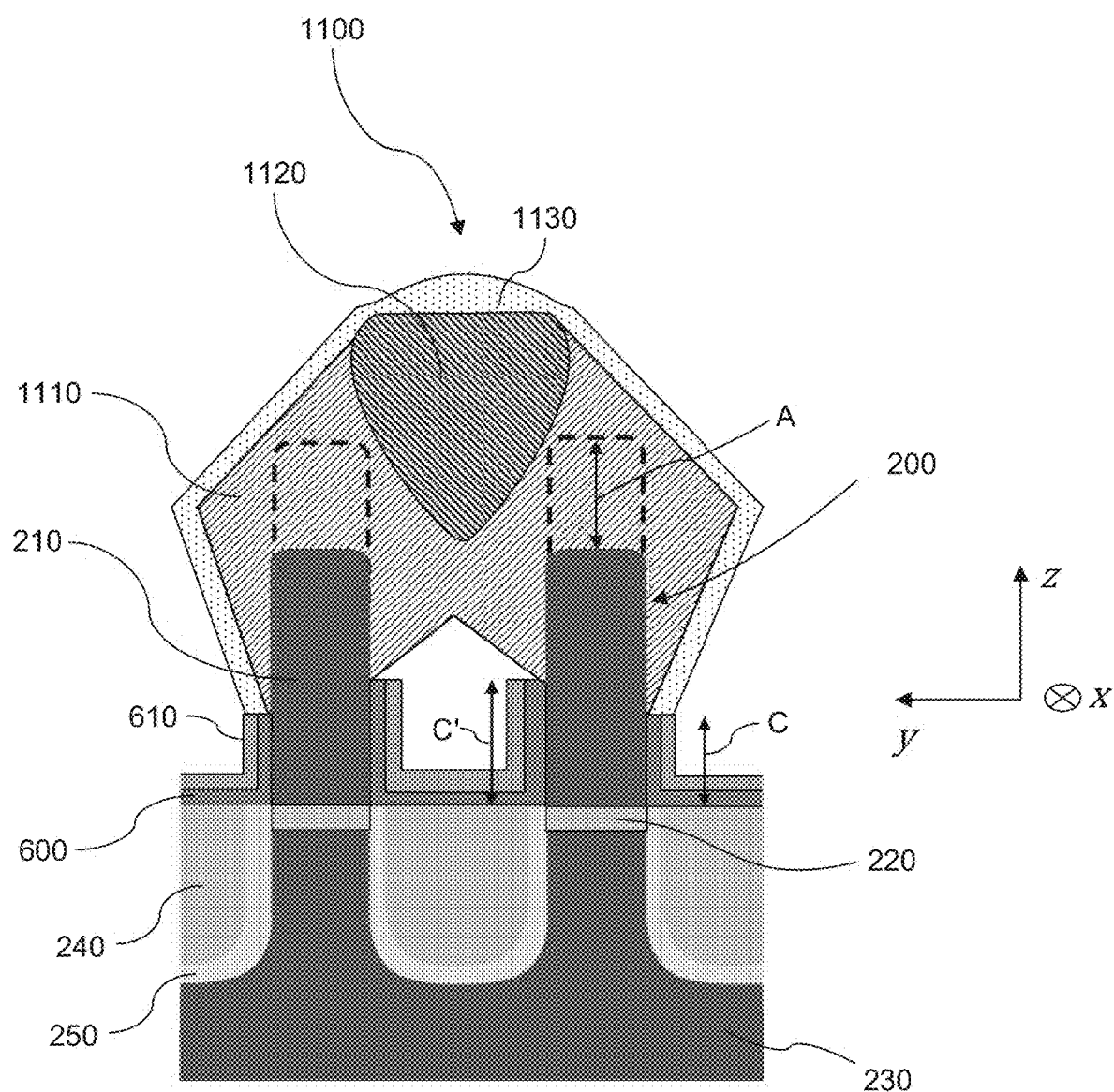
FIG. 11 is a cross-sectional view of an exemplary SiGe source/drain epitaxial stack grown in an area of a chip with a first type of devices, according to some embodiments.

As discussed above, sidewall heights C and C' of the spacer stack may control the size volume) of a SiGe source/drain epitaxial stack grown on fin recessed regions 700 of fins 200. For example, FIG. 11 shows an exemplary fin recessed region 700 of fins 200 in an area of a chip with a first type of devices (e.g., logic devices) after the formation of a SiGe source/drain epitaxial stack 1100. In some embodiments, due to the combination of sidewall heights C and C' of the spacer stack and the recess amount A of fins 200 in fin recessed regions 700, the respective SiGe source drain epitaxial stacks from adjacent fin recessed regions 700 of fins 200 can grow and merge to form a merged SiGe source/drain epitaxial stack 1100.

According to some embodiments, merged SiGe source/drain epitaxial stack 1100 may include three or more SiGe epitaxial sub-layers. By way of example and not limitation, merged SiGe source/drain epitaxial stack 1100 may include a first epitaxial sub-layer 1110, a second epitaxial sub-layer 1120, and a third epitaxial sub-layer 1130. According to some embodiments, epitaxial sub-layers 1110, 1120, and 1130 are grown in succession and can have different germanium (Ge) atomic percentages (at. %) and boron (B) dopant concentrations. Germanium and boron-dopant concentrations can be modulated during the growth process, according to some embodiments.

In some embodiments, the SiGe epitaxial growth process can be performed at temperatures that may range from about 450° C. to about 740° C., During the epitaxial growth, the process pressure can range from about 1 to about 100 Torr, and the reactant gasses may include (i) silane ($SiH_4$), disilane ($Si_2H_6$), germane ($GeH_4$), or diborane ($B_2H_6$), and (ii) hydrochloric acid (HCl), with hydrogen ($H_2$), nitrogen ($N_2$), or argon (Ar). The aforementioned ranges and types of gasses are exemplary and are not intended to be limiting. In some embodiments, the shape and size (e.g., volume) of SiGe source/drain epitaxial stack 1100 may depend on a combination of (i) the growth conditions of each individual epitaxial sub-layer (e.g., gas flows, wafer temperature, and process pressure), (ii) the sidewall heights C and C' of spacer 600 and spacer 610 on the sidewall surfaces of fins 200 in fin recessed regions 700, and/or (iii) the recess amount A of fins 200 in fin recessed region 700.

In some embodiments, the thickness of first epitaxial sub-layer 1110 can range from about 10 nm to about 40 nm. According to some embodiments, first epitaxial sub-layer 1110 can be thicker than second epitaxial sub-layer 1120, and second epitaxial sub-layer 1120 can be thicker than third epitaxial sub-layer 1130. According to some embodiments, the thickness of first epitaxial sub-layer 1110 can range from about 20 nm to about 80 nm, the thickness of the second epitaxial sub-layer 1120 can range from about 10 nm to about 60 nm, and the thickness of the third epitaxial layer can range from about 2 nm to about 15 nm. Further, second epitaxial sub-layer 1120 can be "sandwiched" between two neighboring fins 200, and third epitaxial sub-layer 1130 can be grown over the first and second epitaxial sub-layers 1110 and 1120, as shown in FIG. 11.

According to some embodiments, the boron concentration can increase from first epitaxial sub-layer 1110 to second epitaxial sub-layer 1120 and from second epitaxial sub-layer 1120 to third epitaxial sub-layer 1130. For example, first epitaxial sub-layer 1110 can have a boron concentration between about $1 \times 10^{19}$ atoms/$cm^3$ and about $1 \times 10^{20}$ atoms/$cm^3$; second epitaxial sub-layer 1120 can have a boron concentration between about $5 \times 10^{19}$ atoms/$cm^3$ and about $2 \times 10^{21}$ atoms/$cm^3$; and third epitaxial sub-layer 1130 can have a boron concentration between about $1 \times 10^{20}$ atoms/$cm^3$ and about $2 \times 10^{21}$ atoms/$cm^3$.

Figure 13:
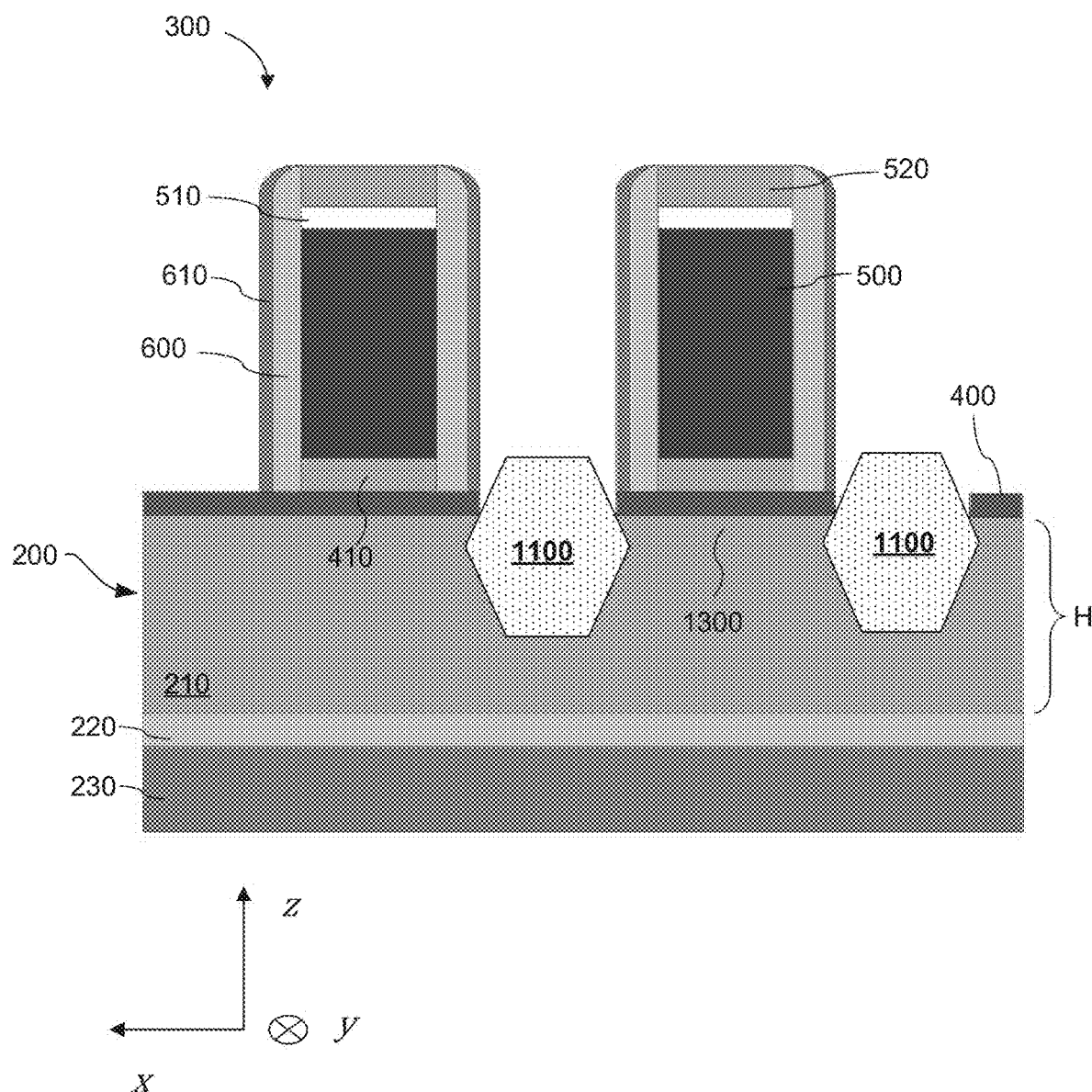
FIG. 13 is a cross-sectional view of example patterned gate structures on a fin after the formation of merged source/drain regions between the patterned gate structures, according to some embodiments.

In some embodiments, the germanium concentration can increase from first epitaxial sub-layer 1110 to second epitaxial sub-layer 1120 and from second epitaxial sub-layer 1120 to third epitaxial sub-layer 1130. For example, first epitaxial sub-layer 1110 can have a germanium concentration between about 15 at. % and about 35 at. %; second epitaxial sub-layer 1120 can have a germanium concentration between about 30 at. % and about 65 at. %; and third epitaxial sub-layer 1130 can have a germanium concentration between about 40 at. % to 65 at. %. According to some embodiments, the external stress induced to SiGe strained material 210 by SiGe source/drain epitaxial stack 1100 can be proportional to the germanium and boron concentrations of SiGe epitaxial sub-layers 1110, 1120, and 1130. For example, the higher the germanium and boron concentrations, the higher the induced stress in the channel region (e.g., SiGe strained material 210). According to some embodiments, the stress from merged SiGe source/drain epitaxial stack 1100, which is induced in a fully strained channel, is higher at the top of the channel and lower towards the bottom of the channel. According to some embodiments, referring to FIG. 13, a channel region 1300 can be located in the fin under gate structure 300 and extend between two neighboring merged Si/Ge source/drain epitaxial stacks 1100 (e.g., in the x-direction as shown in FIG. 13).

The aforementioned germanium and boron concentrations for each sub-layer of merged SiGe source/drain epitaxial stack 1100 are exemplary and should not be considered limiting. Further, and according to some embodiments, the boron and germanium concentrations for each of the SiGe sub-layers (e.g., 1110, 1120, and 1130) can be modulated depending on the germanium concentration profile of SiGe strained material 210 and the desired level of externally induced stress in the fully strained channel region.

Figure 12:
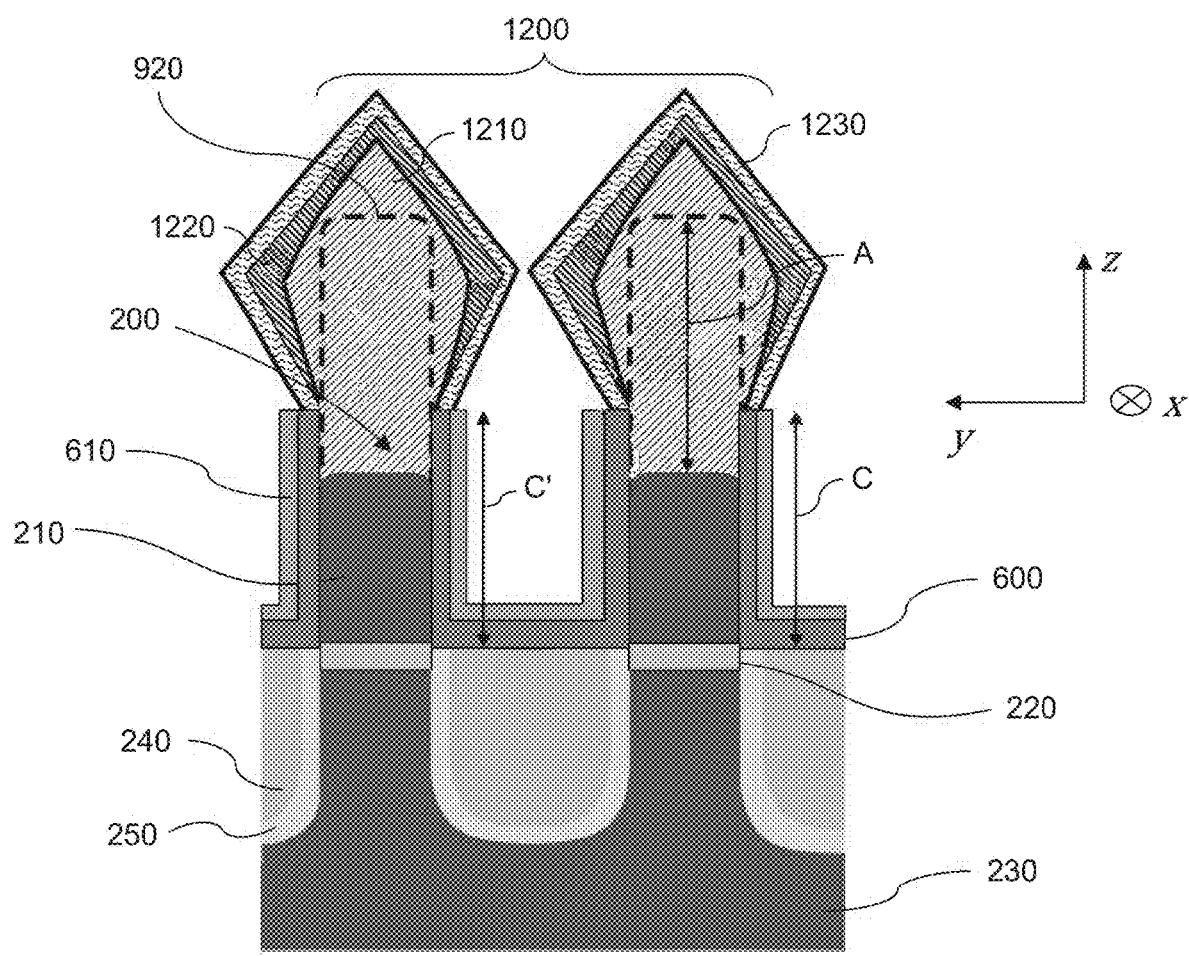
FIG. 12 is a cross-sectional view of an exemplary SiGe source/drain epitaxial stack grown in an area of a chip with a second type of devices, according to some embodiments.

SiGe source/drain epitaxial stacks 1200 in FIG. 12 have been grown concurrently with Side source/drain epitaxial stacks 1100 on respective fin recessed regions 700 of fins 200 in an area of a chip with a second type of devices (e.g., memory cells, such as static random access memory cells). In the area with the second type of devices, due to the recess amount A of fins 200 in fin recessed region 700 and the relationship of sidewall height C and C' of the spacer stack, the volume of each of the SiGe source/drain epitaxial stacks 1200 can be controlled. Consequently, SiGe source/drain epitaxial stacks 1200 grown on adjacent respective fin recessed regions 700 of fins 200 may be separated (e.g., not merged).

SiGe source/drain epitaxial stack 1200 in respective areas of a chip with first and second types of devices may include at least three SiGe sub-layers with different germanium and boron dopant concentrations, according to some embodiments. Additionally, merged SiGe source/drain epitaxial stacks in areas of the chip with the first type of devices may be formed between two or more adjacent fin recessed regions 700 of fins 200. In some embodiments, SiGe source/drain epitaxial stack 1200 may include more than three sub-layers.

In some embodiments, the spacer stack (e.g., spacers 600 and 610) are removed from the fins after the formation of SiGe source/drain epitaxial stacks 1100 and 1200.

The present disclosure is directed to an exemplary fabrication method of SiGe source/drain epitaxial stacks in areas of a chip with a first type of devices (e.g., logic devices) and a second type of devices (e.g., memory cells, such as static random access memory cells). The formed SiGe source/drain epitaxial stacks can have a boron doping profile and germanium concentration that can induce additional external stress to a fully strained SiGe channel. According to some embodiments, the additional stress can offset a possible stress loss in the fully strained SiGe channel. A SiGe source drain/epitaxial layer, as described in the embodiments herein, can exhibit a stress gradient along its height. For example, the stress induced to the channel region can be higher at the top of the channel region than towards the bottom of the channel region. According to some embodiments, the stress profile of the SiGe source/drain epitaxial layer can be modulated through the boron doping and germanium concentrations in each SiGe source/drain epitaxial layer. In some embodiments, the shape and size (e.g., volume) of the SiGe source/drain epitaxial stack may depend on a combination of (i) the growth conditions of each individual epitaxial sub-layer gas flows, wafer temperature, and process pressure), (ii) the sidewall height of the spacer stack on each sidewall surface of the fin recessed region of the fins, and/or (iii) the recess amount of the fins in the openings of the SiGe strained material between the gate structures.

In some embodiments, a method includes forming one or more gate structures over a fin, where the fin includes a fin height, a first sidewall, and a second sidewall opposite to the first sidewall. The method also includes forming a first spacer on the first sidewall of the fin and a second spacer on the second sidewall of the fin; etching the fin to reduce the tin height between the one or more gate structures; and etching the first spacer and the second spacer between the one or more gate structures so that the etched first spacer is shorter than the etched second spacer and the first and second etched spacers are shorter than the etched fin. The method further includes forming an epitaxial stack on the etched fin between the one or more gate structures.

In some embodiments, a method includes forming gate structures over a fin, where the fin has a first fin height; forming a spacer stack on a sidewall of the fin, where the spacer stack has a spacer height; selectively recessing the fin between the gate structures to decrease the first fin height to a second fin height, where the second fin height is shorter than the spacer height; and forming, between the gate structures, an epitaxial stack on the fin.

In some embodiments, a structure includes a first fin and a second fin parallel to each other; a first spacer on a first sidewall of the first and second fins, where the first sidewall of the first fin faces the first sidewall of the second fin; a second spacer on a second sidewall of the first and second fins with the second spacer having a different height from the first spacer and the first and second spacers being shorter than the first and second fins. The structure further includes an epitaxial stack with a variable germanium and boron concentration formed on the first and second fins, where the epitaxial stack induces a gradient stress to an adjacent channel region. The epitaxial stack includes a first common epitaxial sub-layer, with a first thickness, shared between the first and second fins; a second epitaxial sub-layer, with a second thickness, formed between the first and second fins and over the first shared epitaxial sub-layer; and a third epitaxial layer, with a third thickness, formed over the first shared and second epitaxial sub-layers, where the first thickness is greater than the second thickness and the second thickness is greater than the third thickness.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first fin on a substrate, the first fin having first and second sidewalls opposite to one another;
    a second fin parallel to the first fin, the second fin having first and second sidewalls, wherein the first sidewall of the second fin faces the first sidewall of the first fin;
    first spacers on the first sidewalls of each of the first and second fins, the first spacers being shorter than the first fins;
    second spacers on the second sidewalls of each of the first and second fins, the second spacers being shorter than the second fins and having different heights than the first spacers;
    a source/drain epitaxial stack formed on each of the first and second fins, wherein the source/drain epitaxial stack comprises:
        a first epitaxial sub-layer having a first thickness and between the first and second fins;
        a second epitaxial sub-layer, having a second thickness, between the first and second fins, and over the first epitaxial sub-layer; and
        a third epitaxial sub-layer, having a third thickness, over the first and second epitaxial sub-layers, wherein the first thickness is greater than the second thickness and the second thickness is greater than the third thickness; and
    a gate structure over channel regions of the first and second fins.

2. The device of claim 1, wherein each of the first and second fins comprises a silicon germanium strained material.

3. The device of claim 1, wherein the source/drain epitaxial stack is on a portion of the first and second fins not covered by the first and second spacers.

4. The device of claim 1, wherein the second spacers are shorter than the first spacers.

5. The device of claim 1, wherein a gradient stress is higher on top portions of the channel regions than on bottom portions of the channel regions.

6. The device of claim 1, wherein the first epitaxial sub-layer comprises germanium with an atomic percentage between about 15% and about 35%, the second epitaxial sub-layer comprises germanium with an atomic percentage between about 30% and about 65%, and the third epitaxial sub-layer comprises germanium with an atomic percentage between about 40% and about 65%.

7. The device of claim 1, wherein:
    the first epitaxial sub-layer comprises boron with a dopant concentration between about $1\times10^{19}$ atoms/cm$^3$ and about $1\times10^{20}$ atoms/cm$^3$;
    the second epitaxial sub-layer comprises boron with a dopant concentration between about $5\times10^{19}$ atoms/cm$^3$ and about $2\times10^{20}$ atoms/cm$^3$; and
    the third epitaxial sub-layer comprises boron with a dopant concentration between about $1\times10^{20}$ atoms/cm$^3$ and about $2\times10^{20}$ atoms/cm$^3$.

8. A device, comprising:
    a substrate having a pair of fins thereon, wherein each fin of the pair of fins has a first fin region with a first fin height and a second fin region with a second fin height different from the first fin height;
    spacers on sidewalls of the second fin region of each fin, wherein the spacers are taller than the second fin height and shorter than the first fin height;
    a source/drain epitaxial stack disposed on the second fin region of each fin of the pair of fins and in contact with respective first fin regions of the pair of fins, the source/drain epitaxial stack comprising sub-layers having different dopant concentrations; and
    a gate structure over the pair of fins.

9. The device of claim 8, wherein the first fin height is greater than the second fin height.

10. The device of claim 8, wherein the pair of fins comprise a strained material.

11. The device of claim 8, wherein the pair of fins comprise silicon germanium.

12. The device of claim 8, wherein a ratio between the second fin height and the first fin height is between about 0.5 and about 1.

13. The device of claim 8, wherein the spacers comprise a first spacer on the sidewalls of the second fin region of each fin and a second spacer on the first spacer.

14. The device of claim 8, wherein the gate structure is over the first fin region in the pair of fins.

15. The device of claim 8, wherein the source/drain epitaxial stack disposed on each fin of the pair of fins are spaced apart.

16. A device, comprising:
- a substrate;
- a first fin and a second fin disposed on the substrate and parallel to one another, wherein the first and second fins comprise inner sidewalls facing each other and outer sidewalls opposite to the inner sidewalls;
- first spacers on portions of the inner sidewalls of each of the first and second fins;
- second spacers on portions of the outer sidewalls of each of the first and second fins, wherein the second spacers are shorter than the first spacers;
- epitaxial source/drain regions on the inner and outer sidewalls of the first and second fins not covered by the first and second spacers; and
- a gate structure over the fins.

17. The device of claim 16, wherein each of the first and second fins comprises a first region with a first height and a second region with a second height shorter than the first height.

18. The device of claim 17, wherein the first spacers, the second spacers, and the epitaxial source/drain regions are formed on respective second regions of the first and second fins.

19. The device of claim 17, wherein the first spacers are shorter than the second height.

20. The device of claim 17, wherein the epitaxial source/drain regions are in contact with the first region of the first and second fins.

* * * * *

UNITED STATES PATENT AND TRADEMARK OFFICE
CERTIFICATE OF CORRECTION

PATENT NO. : 12,021,142 B2
APPLICATION NO. : 17/876255
DATED : June 25, 2024
INVENTOR(S) : More et al.

Page 1 of 1

It is certified that error appears in the above-identified patent and that said Letters Patent is hereby corrected as shown below:

On the Title Page

Column 1, Item (72), in "Inventors", Line 2, delete "Hsin-Chu" and insert -- Hsinchu --, therefor.

Column 1, Item (63), under "Related U.S. Application Data", delete "(60)" and insert -- (63) --, therefor.

In the Claims

In Column 12, Claim 7, Line 44, delete "$2 \times 10^{20}$" and insert -- $2 \times 10^{21}$ --, therefor.

In Column 12, Claim 7, Line 47, delete "$2 \times 10^{20}$" and insert -- $2 \times 10^{21}$ --, therefor.

Signed and Sealed this
Eighteenth Day of November, 2025

John A. Squires
*Director of the United States Patent and Trademark Office*